(12) United States Patent
Zhang et al.

(10) Patent No.: US 9,659,820 B2
(45) Date of Patent: May 23, 2017

(54) INTERCONNECT STRUCTURE HAVING LARGE SELF-ALIGNED VIAS

(71) Applicants: International Business Machines Corporation, Armonk, NY (US); STMICROELECTRONICS, INC., Coppell, TX (US)

(72) Inventors: John H. Zhang, Altamont, NY (US); Lawrence A. Clevenger, LaGrangeville, NY (US); Carl Radens, LaGrangeville, NY (US); Yiheng Xu, Hopewell Junction, NY (US); Richard Stephen Wise, Los Altos, CA (US); Akil K. Sutton, Hopewell Junction, NY (US); Terry Allen Spooner, Clifton Park, NY (US); Nicole A. Saulnier, Albany, NY (US)

(73) Assignees: International Business Machines Corporation, Armonk, NY (US); STMICROELECTRONICS, INC., Coppell, TX (US)

(*) Notice: Subject to any disclaimer, the term of this patent is extended or adjusted under 35 U.S.C. 154(b) by 0 days.

(21) Appl. No.: 15/143,969

(22) Filed: May 2, 2016

(65) Prior Publication Data
US 2016/0247722 A1 Aug. 25, 2016

Related U.S. Application Data

(60) Division of application No. 14/314,945, filed on Jun. 25, 2014, now Pat. No. 9,391,020, which is a
(Continued)

(51) Int. Cl.
*H01L 21/768* (2006.01)
*H01L 23/522* (2006.01)
(Continued)

(52) U.S. Cl.
CPC .... *H01L 21/76897* (2013.01); *H01L 21/0274* (2013.01); *H01L 21/31116* (2013.01);
(Continued)

(58) Field of Classification Search
CPC ............ H01L 21/76897; H01L 21/0274
(Continued)

(56) References Cited

U.S. PATENT DOCUMENTS

| 4,125,854 A | 11/1978 | McKenny et al. |
| 5,840,624 A * | 11/1998 | Jang ............... H01L 21/31116 257/E21.252 |

(Continued)

OTHER PUBLICATIONS

Fukasawa, et al., "BEOL process integration with Cu/SiCOH (k=2.8) Low-k Interconnects at 65 nm Groundrules," Proceedings of the IEEE International Interconnect Technology Conference, Jun. 6-8, 2005, pp. 9-11.
(Continued)

*Primary Examiner* — Dung Le
(74) *Attorney, Agent, or Firm* — Scully, Scott, Murphy & Presser, P.C.; Steven J. Meyers

(57) ABSTRACT

A method of forming a wavy line interconnect structure that accommodates small metal lines and enlarged diameter vias is disclosed. The enlarged diameter vias can be formed using a self-aligned dual damascene process without the need for a separate via lithography mask. The enlarged diameter vias make direct contact with at least three sides of the underlying metal lines, and can be aligned asymmetrically with respect to the metal line to increase the packing density of the metal pattern. The resulting vias have an aspect ratio that is relatively easy to fill, while the larger via footprint provides low via resistance. By allowing the via footprint to exceed the minimum size of the metal line width, a path is
(Continued)

cleared for further process generations to continue shrinking metal lines to dimensions below 10 nm.

9 Claims, 14 Drawing Sheets

Related U.S. Application Data continuation-in-part of application No. 14/231,448, filed on Mar. 31, 2014.

(51) Int. Cl.
*H01L 23/528* (2006.01)
*H01L 23/532* (2006.01)
*H01L 21/027* (2006.01)
*H01L 21/311* (2006.01)

(52) U.S. Cl.
CPC .... *H01L 21/31144* (2013.01); *H01L 21/7681* (2013.01); *H01L 21/7682* (2013.01); *H01L 21/76808* (2013.01); *H01L 21/76816* (2013.01); *H01L 21/76835* (2013.01); *H01L 21/76843* (2013.01); *H01L 21/76877* (2013.01); *H01L 23/528* (2013.01); *H01L 23/5222* (2013.01); *H01L 23/5226* (2013.01); *H01L 23/5283* (2013.01); *H01L 23/53238* (2013.01); *H01L 23/53295* (2013.01); *H01L 2924/0002* (2013.01)

(58) Field of Classification Search
USPC .................................................. 438/622, 637
See application file for complete search history.

(56) References Cited

U.S. PATENT DOCUMENTS

| | | | |
|---|---|---|---|
| 7,056,823 B2* | 6/2006 | Cho | H01L 21/31116 257/773 |
| 9,076,729 B2 | 7/2015 | Ting | |
| 9,214,429 B2 | 12/2015 | Zhang et al. | |
| 2006/0063372 A1* | 3/2006 | Uesugi | H01L 21/76802 438/618 |
| 2010/0327445 A1* | 12/2010 | Filippi | H01L 21/76802 257/751 |
| 2015/0162277 A1 | 6/2015 | Zhang et al. | |

OTHER PUBLICATIONS

Ida et al., "PECVD Low-k (−2.7) Dielectric SiCOH Films Development and Integration for 65 nm CMOS Devices," Materials Research Society, Advanced Metallization Conference Proceedings XX.I, pp. 89-95, 2006.

Wolf, "Silicon Processing for the VLSI Era", 2002, pp. 674-679, vol. 4.

\* cited by examiner

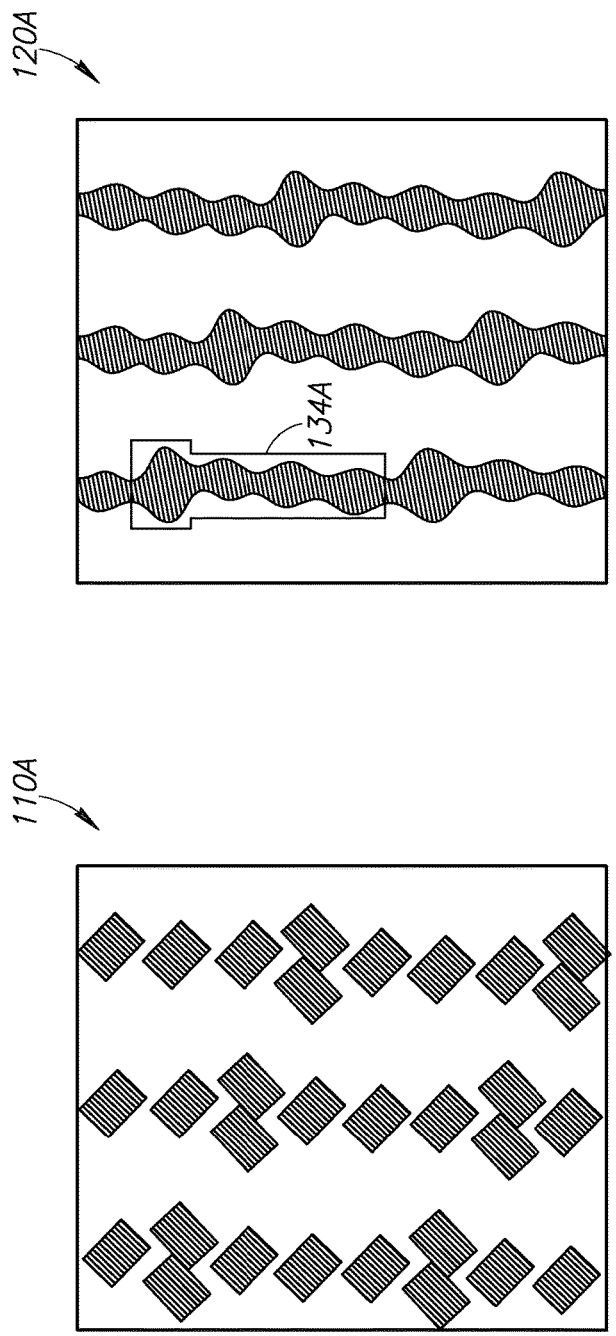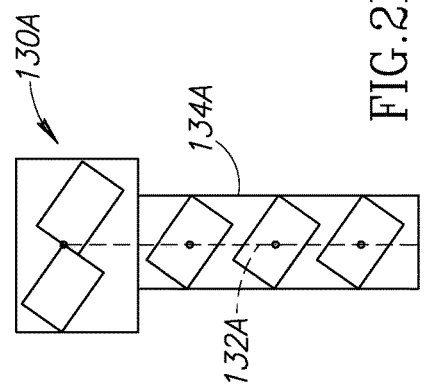
FIG. 2E
FIG. 2F
FIG. 2D

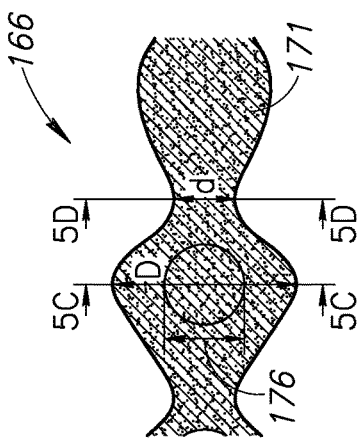
FIG.5A
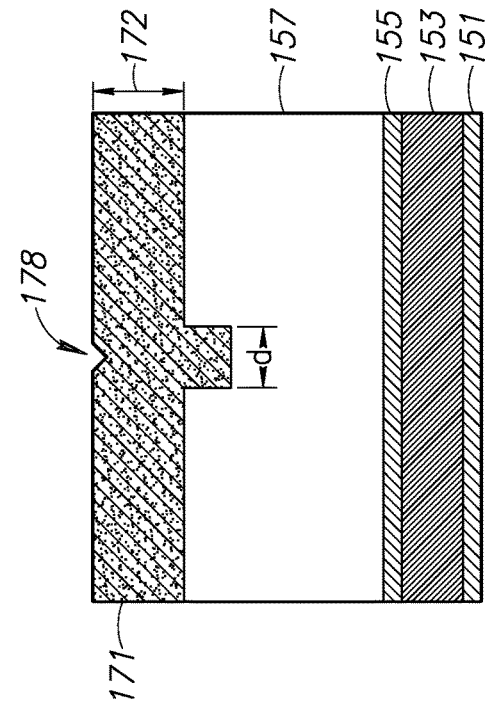
FIG.5B
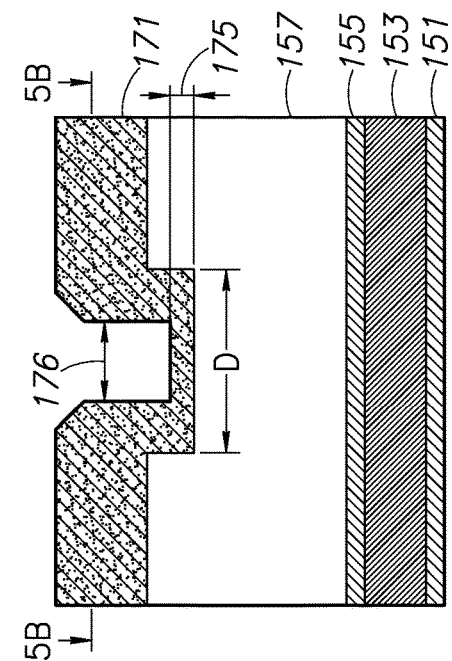
FIG.5C
FIG.5D

INTERCONNECT STRUCTURE HAVING LARGE SELF-ALIGNED VIAS

BACKGROUND

Technical Field

The present disclosure generally relates to high speed integrated circuits, and in particular, to the fabrication of interconnect structures using a self-aligned dual damascene process.

Description of the Related Art

As integrated circuit technology advances, building metal interconnect structures that are used to wire transistors together becomes more and more challenging. Metal lines can assume a variety of different shapes, from straight wires to cells made up of intertwined C-shapes. Regardless of their shapes, design rules for metal lines are typically based on scaling a pitch dimension that assumes a regular pattern of equal line widths and spacings between the metal lines at each metal layer. Metal line widths are generally expected to shrink with every new process generation to further improve integrated circuit performance.

Depending on the type of process integration scheme used, vias connecting stacked metal lines vertically to one another are constrained to be smaller than the metal lines in order for the via footprint to be surrounded by metal. Such a constraint exists, for example, when forming vias according to a self-aligned dual damascene process that avoids a separate via lithography step. Thus, as the metal line design widths shrink with each process generation, the self-aligned vias shrink as well. However, smaller vias incur higher via resistance, causing RC delays to worsen. In addition, smaller via footprints cause the via aspect ratio, i.e., the ratio of height to width, to increase, making the vias taller and narrower, and therefore more difficult to fill with metal. Incomplete via fill in turn degrades reliability by causing open circuit failures, for example. Thus, for multiple reasons, it is advantageous for via footprints to remain large, while metal lines continue to shrink with each technology generation.

BRIEF SUMMARY

An interconnect structure having wavy metal lines allows via footprints to exceed the nominal width of metal line portions connecting them. In one embodiment, the resulting metal line profile shape resembles a bicycle chain. In another embodiment, the metal line resembles a linear series of T-shaped unit cells, in which the width of the metal line alternates between a narrow value, an intermediate value, and a wide value. The wide value corresponds to a large via landing pad for vias forming an electrical connection to the next highest metal layer. To achieve greater lateral packing density, adjacent wavy metal lines can be staggered so that the via landing pads on one metal line are next to the narrow metal connecting portions of neighboring metal lines. By lifting the shrink constraint for vias, thereby allowing the via footprint to exceed the minimum size of the metal line width, a path is cleared for further process generations to continue shrinking metal lines to dimensions below 10 nm.

A wavy line interconnect structure can be formed using a dual damascene process in which vias are self-aligned without the need for a dedicated lithography mask. Instead, metal line trenches are lined with a sacrificial layer that completely fills the narrow spaces while underfilling the wide spaces that correspond to via locations. The sacrificial layer thus acts as a via hard mask, allowing etching of the underlying thick dielectric block, while protecting narrow features of the trenches that correspond to the metal line interconnects. The resulting vias have an aspect ratio that is relatively easy to fill, while the larger footprint provides low via resistance.

One way to pattern wavy metal lines using conventional optical lithography uses a mask cell design that includes a series of rectangular opaque features diagonally offset from one another along an axis. Via landing pads are then added at one end of the mask cell by placing two rectangular features adjacent to one another. The method disclosed takes advantage of the shortcomings of optical lithography to achieve the desired wavy line pattern by anticipating diffraction errors that will occur during exposure of the rectangular features. Such a technique is generally known in the art as optical proximity correction (OPC). Typically, OPC is used to produce square corners where the standard lithography tends to round off the corners of a circuit pattern. In this case, however, the rounding effect is intentional. During the patterning process, corners of the rectangular features will transfer to the photoresist and the metal trench as rounded features. Meanwhile, the offset rectangular features, instead of remaining distinct, will join together to approximate the desired undulating wavy line shape. In similar fashion, each rectangle pair will transfer to the metal trench layer as a combined shape, forming a single large landing pad to accommodate the vias.

According to one embodiment, large vias are designed to land on narrow portions of the wavy metal line instead of, or in addition to, vias that land on the designated landing pads. Normally, when a large via footprint exceeds the size of an underlying metal landing pad, the electrical contact area at the interface is reduced, thereby causing an increase in via resistance. However, if the large via is formed so that the via depth extends to the bottom of the metal line instead of stopping on the top surface of the metal line, an enlarged diameter via is formed that operates with significantly less via resistance. Furthermore, the enlarged diameter via need not be centered on the metal line, but can be aligned asymmetrically with respect to the metal line.

According to one embodiment, an interconnect structure featuring enlarged diameter vias includes a two-component inter-layer dielectric. The two-component ILD includes a bottom dielectric material adjacent to the metal line, and a top dielectric material adjacent to the via. Use of two different materials allows greater flexibility in the circuit design of the overall interconnect structure.

According to one embodiment, adjacent enlarged diameter vias are effectively encapsulated by substituting a silicon carbide-based insulator, e.g., SiC or SiCOH for the low-k ILD materials. Use of such a SiC-based insulator offers additional protection against dielectric breakdown. Forming an air gap within the SiC-based ILD then reduces capacitance between the adjacent enlarged diameter vias to compensate for the increased capacitance of the encapsulating material.

According to one embodiment, an enlarged diameter via surrounds the underlying metal line on all four sides, further increasing the electrical contact area to achieve an additional performance benefit.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

FIGS. 2D, 2E, and 2F show a layout diagram, a top-down scanning electron micrograph, and a unit cell template for creating vertically-oriented wavy metal lines, corresponding to FIGS. 2A, 2B, and 2C, respectively.

FIG. 5A is a process flow diagram showing a detailed sequence of processing steps that can be used to form a sacrificial layer for use as a hard mask, according to one embodiment.

FIG. 5B is a top plan view of wavy trenches after carrying out processing steps shown in FIG. 5A.

FIGS. 5C and 5D are cross-sectional views, along the cut lines shown, of the hard mask after carrying out processing steps shown in FIG. 5A.

DETAILED DESCRIPTION

Figure 1A:
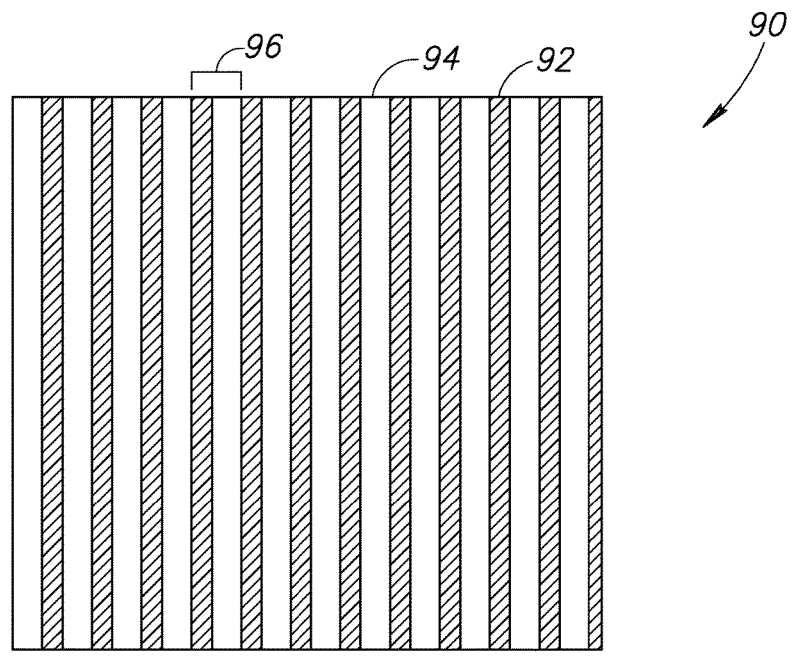
FIG. 1A is derived from a top-down scanning electron micrograph of a conventional array of metal lines, according to the prior art.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to interconnect structures that have been produced; however, the present disclosure and the reference to certain materials, dimensions, and the details and ordering of processing steps are exemplary and should not be limited to those shown.

Turning now to the Figures, FIG. 1A shows a top plan view of a conventional array 90 of metal lines 92 inlaid in a dielectric block 94. Such an array characterized by a pitch 96 of 40 nm or less typically is fabricated of copper or a copper alloy using a dual damascene process, as is well known in the art [see, for example, "Silicon Processing for the VLSI Era," Vol. 4, p. 674-679, by Stanley Wolf]. In short, a dual damascene process entails first forming a trench in the dielectric block 94, and then forming a via that extends from the bottom of the trench to an underlying metal layer. The trench and the via are then filled with metal together in one step. Thus, each interconnect layer entails performing two lithography steps and one metal deposition step. One of the two lithography steps can be eliminated by employing a self-aligned via process in which a sacrificial layer is used as a hard mask. Self-aligned dual damascene vias are also well known in the art and can be understood by referencing the Wolf article cited above. Vias underlying the metal lines 92 are not shown in FIG. 1A because they have equal or smaller widths than the metal lines and they are therefore obscured by the metal lines.

Figure 1B:
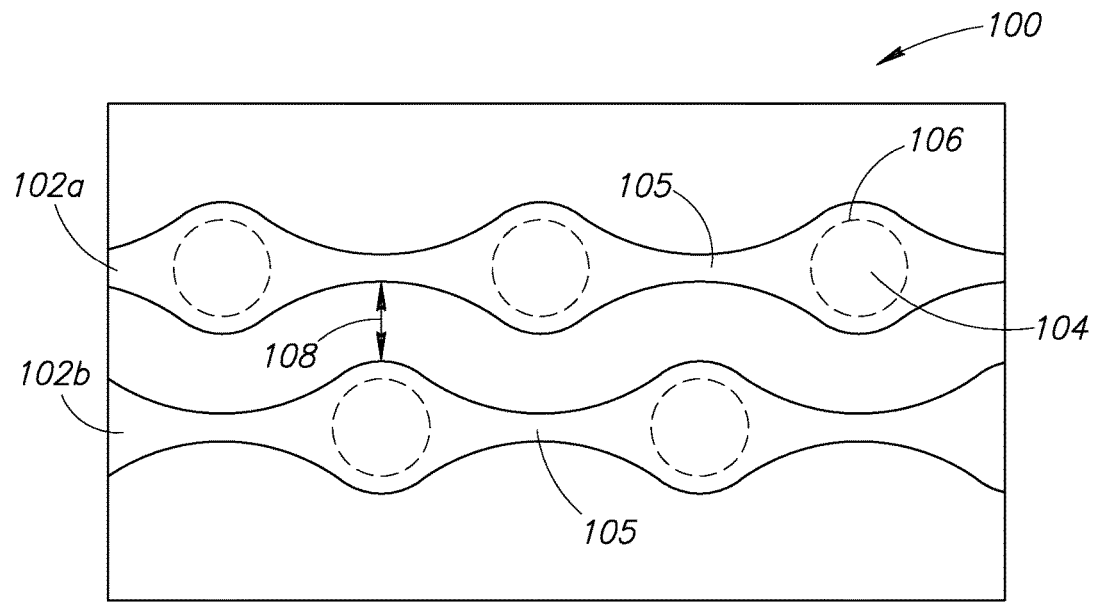
FIG. 1B is a layout diagram of adjacent narrow metal lines encompassing large vias according to a first embodiment in which the metal lines resemble a bicycle chain.

With reference to FIG. 1B, for the reasons explained above, it is desirable to form wavy metal lines 102 shaped like bicycle chain structures 100 in which wide portions 104 accommodate via landing pads 106 spaced periodically between narrow portions 105. Such a configuration allows the via landing pads 106 to exceed the width of the narrow portions 105. Adjacent metal lines 102a and 102b can be staggered relative to one another so that the via landing pads 106 located at the wide portions 104 along 102a are aligned with the narrow portions 105 of neighboring wavy metal line 102b. Thus, the wavy metal lines can maintain a constant spacing 108. The bicycle chain structures 100 are thus one exemplary embodiment of a wavy metal line design that accommodates large vias.

Figures 2A, 2B, 2C:
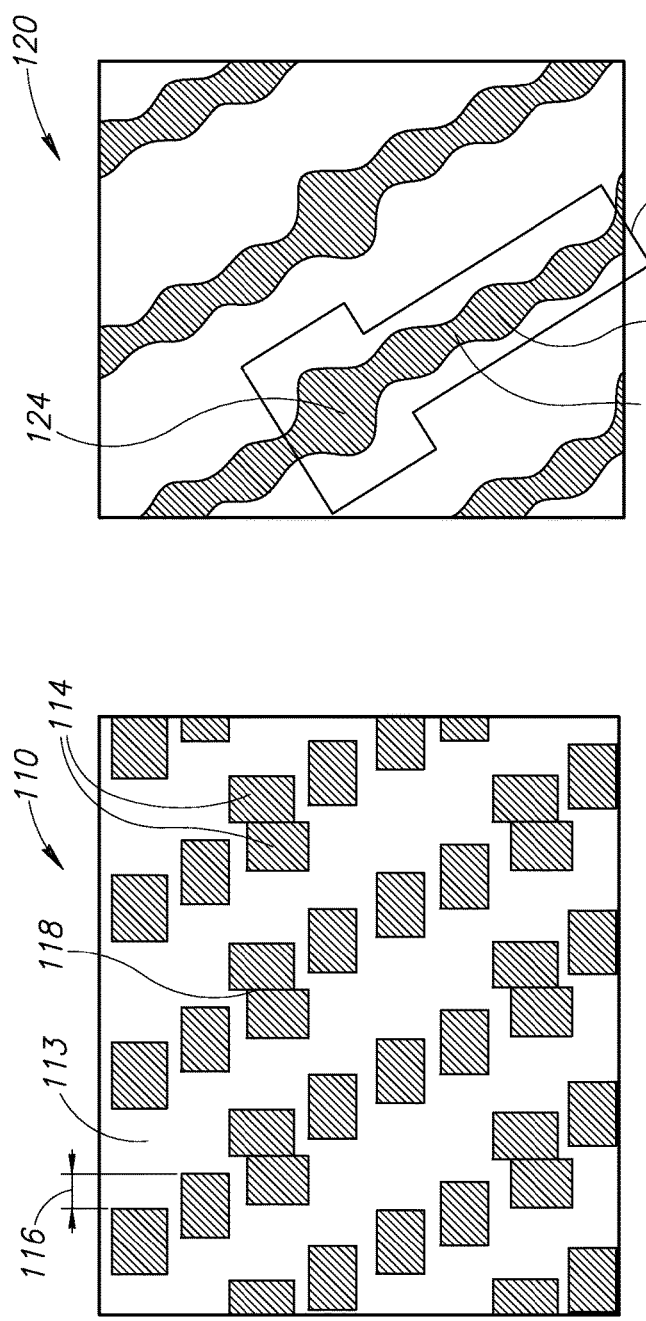
FIG. 2A is a layout diagram of an optical lithography mask design showing regions of chrome on a glass mask plate that can be used to form diagonal wavy metal lines according to a second embodiment.
FIG. 2B is derived from a top-down scanning electron micrograph of a structure as made when the mask has an array of rectangular-shaped vias that create diagonal wavy metal lines having narrow, intermediate, and wide regions, the wide regions accommodating large vias.
FIG. 2C is a schematic of a template corresponding to the unit cell that describes the via shape arrangement shown in FIG. 2B.
Figure 2G:
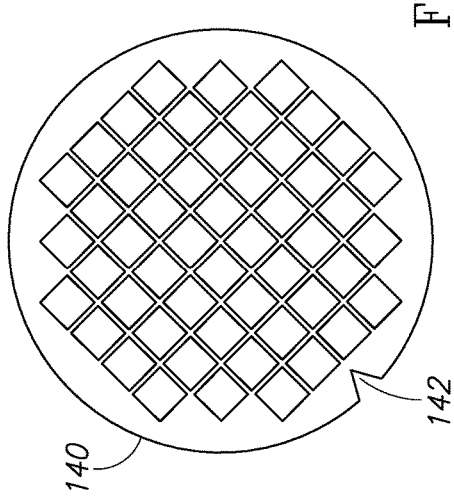
FIGS. 2G, 2H, 2J, and 2K are exemplary wafer maps showing a wafer rotation sequence that facilitates patterning the wavy metal lines in a selected orientation.

A second exemplary embodiment of such a wavy metal line design is shown in FIGS. 2A, 2B, and 2C. FIG. 2A shows an optical lithography wavy line mask design 110 that results in an array of wavy metal lines structures 120 shown in FIG. 2B. The wavy metal line structures 120 include a plurality of narrow portions 122, intermediate width portions 123, and wide portions 124, along each wavy metal line. In one embodiment, the narrow portions 122 are in the range of about 5-30 nm wide, with a nominal pitch of 48 nm. Dimensions of the wide portions 124 are within the range of about 10-40 nm. Wavy metal lines having about three or more narrow portions 122 for every wide portion 124 maintain an average line width that is slightly larger than the width of the narrow portion 122. Again, adjacent metal lines can be staggered so the wide portions 124 of one line are placed next to the intermediate or narrow portions 123, 122 of neighboring lines.

The wavy metal line structures 120 are achieved by approximating the portions of varying widths using rectangular mask features in the wavy line mask design 110. For example, the wavy line mask design 110 can be implemented by forming rectangular opaque features 112 and 114 on a reticle made of chrome on a glass plate 113. When the reticle is exposed to light in an optical lithography stepper or scanner, the light is blocked by the rectangular opaque features 112 and 114. However, diffraction effects cause the pattern of rectangles to become blurred at the target surface, thereby producing the wavy-line patterns shown in FIG. 2B.

The optical lithography wavy line mask design 110 (FIG. 2A) can be thought of as an optical lithography mask cell 130 (FIG. 2C) replicated throughout a region of a larger optical lithography reticle that may include many different mask designs. The optical lithography mask cell 130, shown in FIG. 2C, is then a fundamental building block of the wavy line mask design 110 shown in FIG. 2A. The optical lithography mask cell 130 shows more clearly the relative orientations of the rectangular opaque features 112 and 114. The rectangular opaque features 112 are isolated rectangles, offset from one another by a first offset distance 116. Pairs of rectangular opaque features 114 touch one another at least at a contact point 118, and the pairs are then offset from the rectangular opaque features 112 by a second offset distance 117. Furthermore, the contact point 118 and center points 131 of the rectangular opaque features 112 are aligned along an axis 132. When a template 134 of the mask cell 130 is overlaid onto the wavy metal line structures 120, the various elements of the metal line can more clearly be associated with corresponding mask features that define them. It is noted that the via landing pads 106 that correspond to the wide portions 124 are formed by the pairs of rectangular opaque features 114, while the narrow portions 122 of the metal lines correspond to locations where adjacent rectangular features blur together.

Intentional manipulation of mask features to compensate for shortcomings in lithographic capability is well known in the art of photolithography as Optical Proximity Correction (OPC). OPC is often used to pattern square corners that would otherwise become rounded by diffraction effects. In the present case, however, the rounded features forming the wavy metal line structures 120 are intentionally created by leveraging distortion that occurs in the lithography process, as opposed to correcting for the distortion. While it is true that conventional metal lines are not all as uniform and straight as those shown in FIG. 1A, the resulting wavy metal line structures 120 are unique compared with known existing metal line shapes as shown in documentation describing SRAM cells associated with various microprocessor chips, e.g., those of Texas Instruments OMAP™, TMX320x, D6298x, and the like.

If it is desired to produce a wavy line pattern that is oriented horizontally or vertically instead of diagonally, simply rearranging the rectangular opaque features 112 along a horizontal or vertical axis instead of along the oblique axis 132 may not result in the desired wavy line pattern. One way to change the wavy line orientation is to rotate the wavy line mask design 110 to produce, for example, a vertical wavy line mask design 110A as shown in FIG. 2D. Use of vertical wavy line mask design 110A results in an array of wavy metal line structures 120A shown in FIG. 2E, for which a corresponding optical lithography mask cell 130A (FIG. 2F) is oriented along a vertical axis 132A. However, it may not be feasible or cost-effective to create a new mask design and fabricate a new reticle for each desired orientation. Therefore, an alternative method to produce wavy line patterns having any selected orientation, using the same oblique wavy line mask design 110, is described below.

Figure 2H:
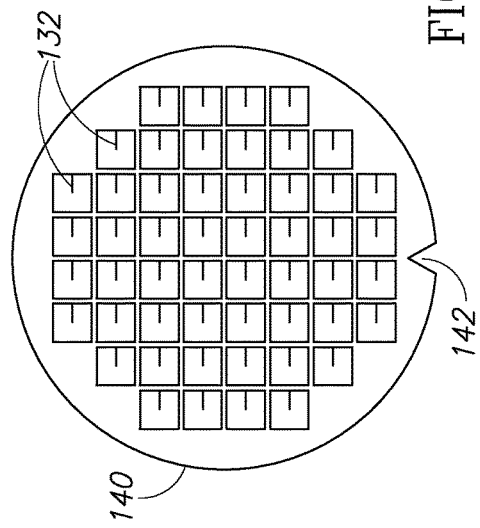
Figure 2J:
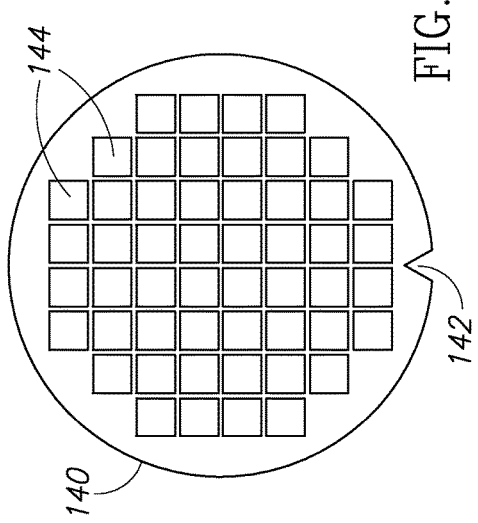
Figure 2K:
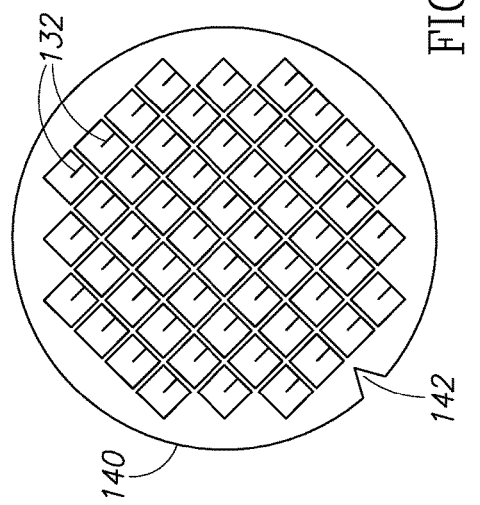

FIGS. 2G, 2H, 2J, and 2K show a series of top plan views of a semiconductor wafer 140, illustrating an exemplary sequence for implementing the oblique wavy line mask design 110 so as to produce wavy metal lines that are oriented at any selected angle. In the example shown, the wafer 140 includes 52 dice 144 that are arranged in a grid. To pattern the dice with wavy metal lines that are oriented horizontally as shown in FIG. 2K, using the oblique wavy line mask design 110, each wafer is rotated before and after photolithography processing. For example, FIG. 2H shows the wafer 140 after rotating clockwise by 45 degrees as indicated by the position of a wafer notch 142. In FIG. 2J, the wafer 140 is then exposed to light through the oblique wavy line mask design 110 wherein the oblique axis 132 of the mask cell 130 is indicated on each die 144. Following lithography processing, the wafer 140 is counter-rotated back to its original notch-down position as shown in FIG. 2K, in which the wavy lines are shown in the desired horizontal orientation with respect to the notch 142. In another example, if a pattern of vertical wavy lines is desired, the wafer 140 undergoes a 45 degree counterclockwise rotation prior to the lithography operation, and a 45 degree clockwise rotation after the lithography operation. In similar fashion, the rotation angle can be altered to achieve any desired orientation of the wavy metal lines.

Figure 3:
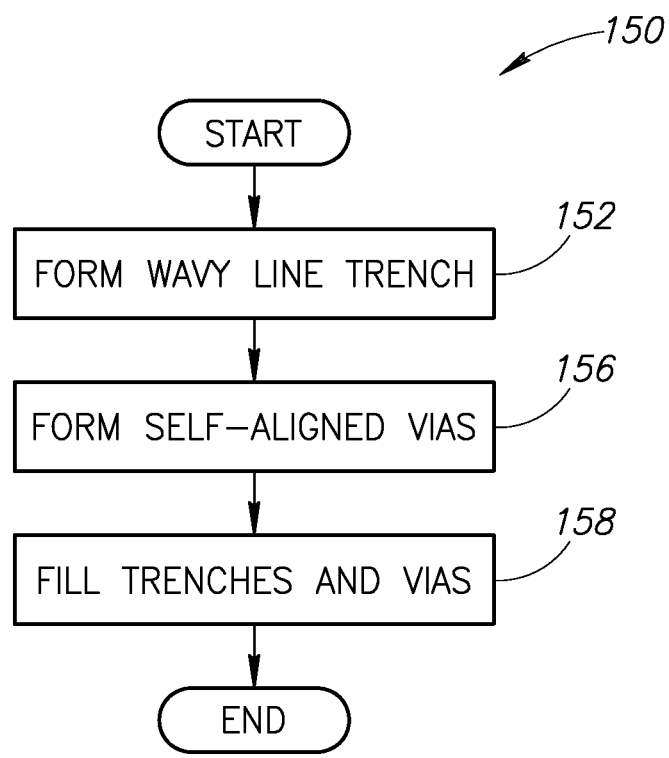
FIG. 3 is a high-level flow diagram of a method of fabricating large self-aligned vias in a dual damascene interconnect process, according to one embodiment.

FIG. 3 shows general steps in a method 150 of fabricating wavy metal lines having large vias. The method 150 is one embodiment of a self-aligned dual damascene process for fabricating an interconnect structure, i.e., a network of wavy metal lines and large vias, that provides electrical connections for transistors within integrated circuits. Metal lines within the interconnect structure have the wavy line pattern of the wavy metal line structures 120 shown in FIG. 2B.

At 152, wavy trenches are formed in a dielectric block.

At 156, large self-aligned vias are formed in the dielectric block, extending away from the wavy trenches.

At 158, the wavy trenches and the large self-aligned vias are filled with metal in the same process step.

FIGS. 4A-7D show and describe in further detail steps in the method 150. In each set of Figures A-D, A is a detailed flow diagram; B is a top plan view showing at least a wide portion 104 and a narrow portion 105 of a wavy metal line 102 after performing the steps shown in A; C is a cross-sectional schematic view through the wide portion 104 that accommodates a via; and D is a cross-sectional view through the narrow portion 105. In accordance with convention, arrows on each cut line represent the direction of an observer's eye looking at the corresponding cut plane.

FIGS. 4A-4D show and describe patterning the wavy line trenches in a dielectric block, at step 152, according to one embodiment. Formation of the wavy line trenches is the only process step in the method 150 that entails use of photolithography. The trench formation begins with a dielectric block 104 that has been deposited onto an underlying metal layer, e.g., metal 1. The dielectric block 157 is made of silicon dioxide or an ultra-low-k (ULK) dielectric material, as is well known in the art. The underlying metal layer includes a metal liner 151 made of, for example, Ti, TiN, or TaN; a layer of bulk metal 153, e.g., copper; and a metal cap layer 155, e.g., silicon nitride carbide (SiNC), as are well known in the art. It is noted that the trench extends in a direction perpendicular to the underlying metal layer.

At 160, photoresist is applied to the thick inter-layer dielectric (ILD) block 157. Applying the photoresist entails first applying an optical planarization layer (OPL) 159, followed by an anti-reflection coating (ARC) 161, and finally the actual photoresist 163. The OPL 159 is used to fine-tune planarization of the surface of the dielectric block 157 prior to exposure, in order to reduce distortion of the pattern. The OPL 159 is made of, for example, a spin-on glass (SOG), as is known in the art.

At 162, the photoresist 163 is patterned by exposure to light through a mask fabricated according to the wavy line mask design 110, followed by treatment with a developer that removes portions of the photoresist 163.

Figure 4A:
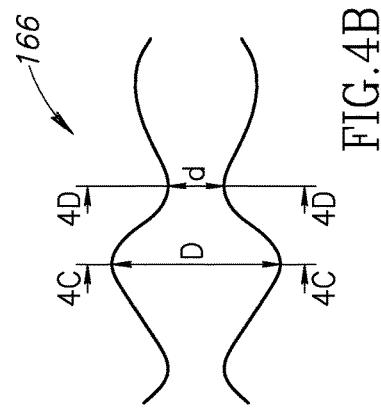
FIG. 4A is a process flow diagram showing a detailed sequence of processing steps that can be used to form wavy trenches using a wavy line mask, according to one embodiment.
Figure 4B:
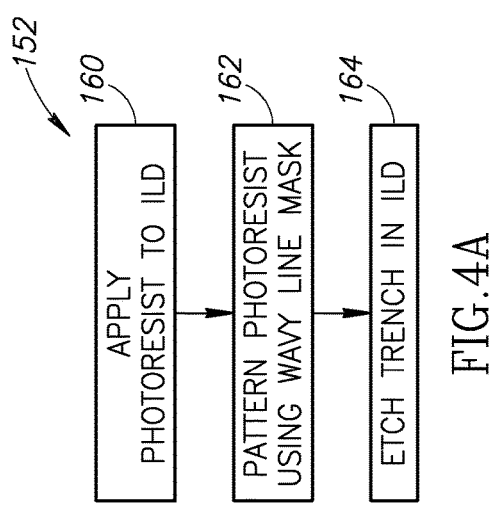
FIG. 4B is a top plan view of wavy trenches after carrying out processing steps shown in FIG. 4A.
Figure 4C:
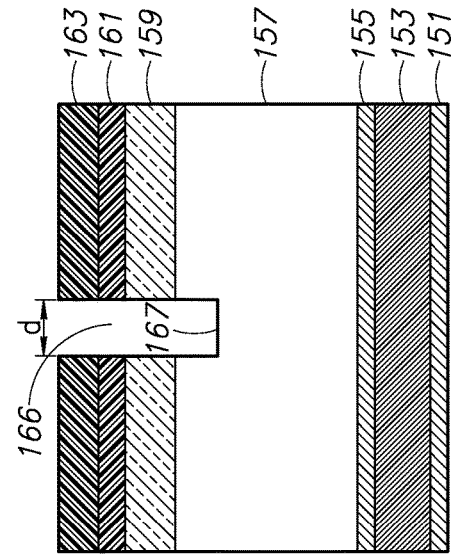
FIGS. 4C and 4D are cross-sectional views, along the cut lines shown, of wavy trenches after carrying out processing steps shown in FIG. 4A.
Figure 4D:
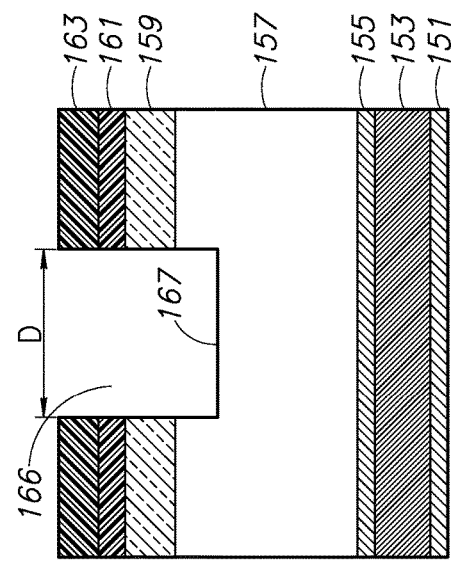

At 164, a wavy line trench 166 is etched in the dielectric block 157 down to a trench depth 167. The wavy line trench 166 includes a wide portion of width D where a large via 169 will be formed, as shown in FIG. 4C, and a narrow portion of width d, that corresponds to the nominal metal line width, e.g., 24 nm, as shown in FIG. 4D.

FIGS. 5A-5D show and describe the formation of a sacrificial, or disposable, layer, according to one embodiment.

At 170, a sacrificial layer 171 is deposited into the wavy line trench 166. In one embodiment, the sacrificial layer 171 is made of a material such as polysilicon, low-temperature silicon dioxide, or SiN. The sacrificial layer 171 overfills the narrow portion of the trench (d) to a narrow portion thickness 172 having a notch 178 therein, while conformally underfilling the wide portion of the trench (D) to a wide portion thickness 175. Thus, as shown in FIGS. 5C and 5D, the narrow portion d of the trench is entirely blocked, while the wide portion D contains a hard mask that will define a large via having a via width 176.

The via width 176 is much greater than the narrow portion, d, of the metal line, which eases formation of the overall interconnect structure. The significance of the independence of the via width from the nominal metal line width d is that a path is cleared for the nominal metal line width in future technology generations to shrink without causing via failures. The metal line widths can continue getting smaller and smaller with each technology generation while the via size remains the same. The narrow portion thickness 172 is larger than d/2, but smaller than D/2. By using the sacrificial layer 171 as a hard mask, a via lithography step is avoided. Via formation without the need for a separate mask layer is referred to by those skilled in the art as a self-aligned via.

In another embodiment, the sacrificial layer 171 is made of a direct self-aligned (DSA) polymer material. A DSA polymer sacrificial layer 171 fills the narrow portions (d) of the wavy line trench so that the narrow portion thickness 172 is negligible. Likewise, the DSA polymer sacrificial layer 171 deposits on the sidewalls of the wide portions (D) to form a hard mask having a negligible wide portion thickness 175. Consequently, use of the DSA polymer as the sacrificial layer 171 simplifies the etch process, as is shown below.

FIGS. 6A-6D show and describe the formation of vias at step 156, according to one embodiment.

At 180, the sacrificial layer 171 is etched to expose a via landing pad 181 at the surface of the underlying bulk metal 153. A first anisotropic etch step removes the sacrificial layer 171 from the bottom of the wavy line trench 166, down to the trench depth 167. If a DSA polymer is used as the sacrificial layer 171, the first anisotropic etch step is not needed because the bottom of the trench is already exposed.

Figure 6A:
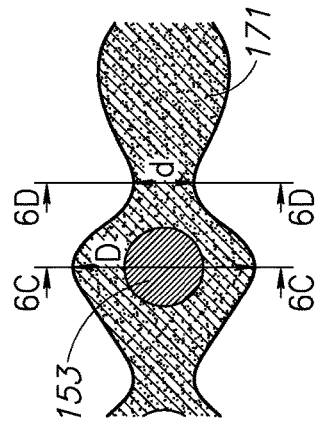
FIG. 6A is a process flow diagram showing a detailed sequence of processing steps that can be used to form large self-aligned vias, according to one embodiment.
Figure 6B:
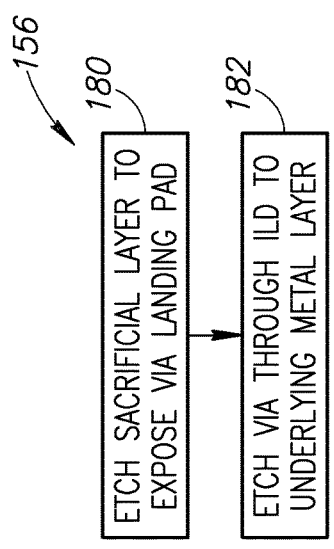
FIG. 6B is a top plan view of wavy trenches after carrying out processing steps shown in FIG. 6A.
Figure 6C:
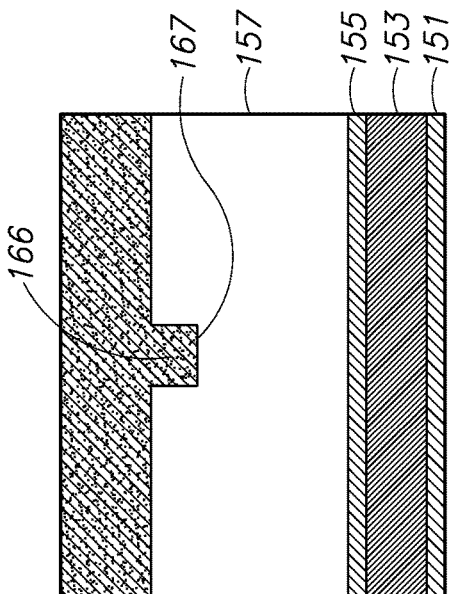
FIGS. 6C and 6D are cross-sectional views, along the cut lines shown, of the large self-aligned vias after carrying out processing steps shown in FIG. 6A.
Figure 6D:
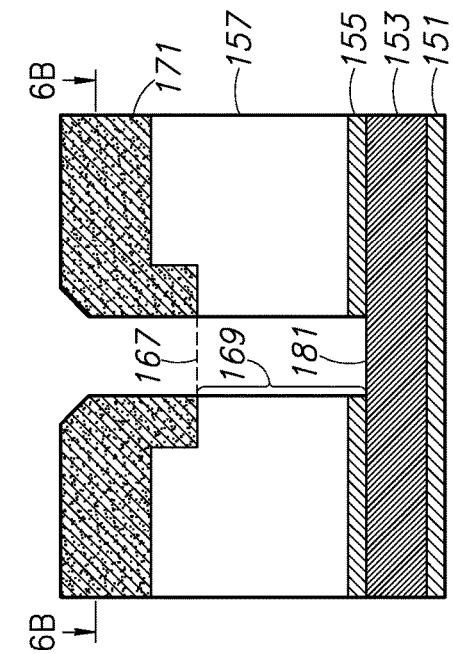

At 182, a second anisotropic etch continues removing dielectric material in a downward direction to the underlying three-metal layer, creating the large via 169. Finally, a third etch step removes the cap layer 155 to expose the bulk metal 153, as shown in FIG. 6C. Meanwhile, as shown in FIG. 6D, the sacrificial layer 171 protects the narrow portion of the wavy line trench 166.

FIGS. 7A-7D show and describe the trench and via fill at step 158, according to one embodiment.

At 190, the sacrificial layer 171 is removed using an etch chemistry that has a high selectivity to the dielectric block 157. For example, if the sacrificial layer 171 is SiN and the dielectric 157 is silicon dioxide, the sacrificial layer 171 can be removed using a phosphoric acid dip.

At 192, the wavy line trench 166 and the large via 169 are filled with metal. The metal fill process includes first depositing a metal liner 195, e.g., titanium (Ti), titanium nitride (TiN), tantalum nitride (TaN), titanium carbide (TiC), cobalt (Co), rubidium (Ru), and combinations thereof; followed by deposition of a bulk metal 197, e.g., aluminum (Al), copper (Cu), tungsten (W), cobalt (Co), nickel silicide (NiSi), cobalt silicide (CoSi), and combinations thereof, wherein combinations include metal laminates, alloys, and the like.

At 194, a chemical mechanical planarization (CMP) step is performed to planarize the metal liner 195 and bulk metal 197 to the height of the dielectric block 157.

Figure 7A:
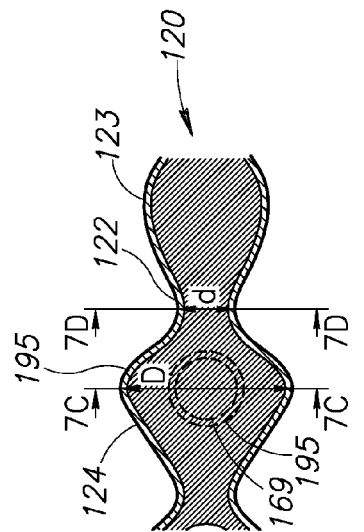
FIG. 7A is a process flow diagram showing a detailed sequence of processing steps that can be used to fill the wavy line trenches and the large self-aligned vias with metal, according to one embodiment.
Figure 7B:
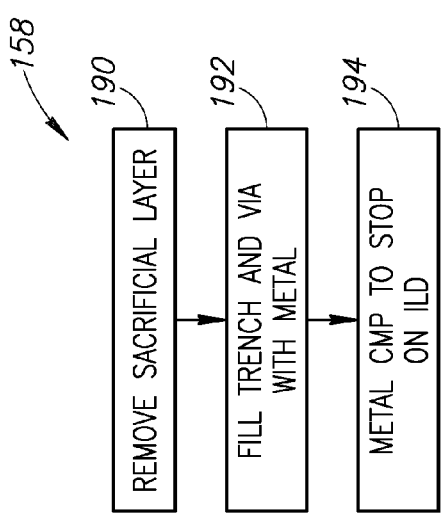
FIG. 7B is a top plan view of wavy trenches after carrying out processing steps shown in FIG. 7A.
Figure 7C:
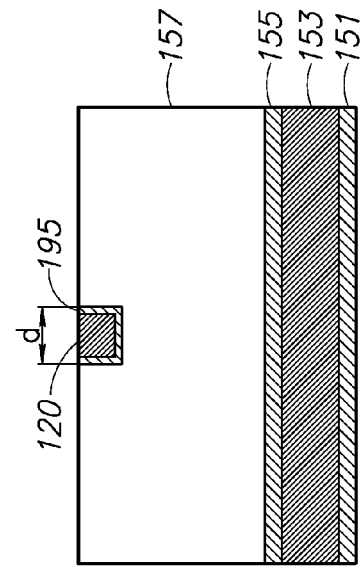
FIGS. 7C and 7D are cross-sectional views, along the cut lines shown, of wavy metal lines and filled vias after carrying out processing steps shown in FIG. 7A.
Figure 7D:
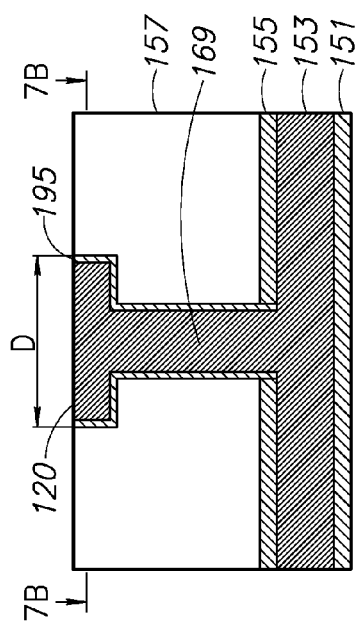

The resulting metal lines shown in FIG. 7B are the wavy metal line structures 120 shown in FIG. 2B, including the narrow portions 122 of width d, intermediate portions 123, and wide portions 124 of width D, accommodating the large via 169. If, for example, the metal lines thus formed are at metal 2, the wide portions 124 serve as large via landing pads 106 for subsequently formed large vias that will later connect to upper metal lines, e.g., metal 3. It is noted that the large via 169 has an aspect ratio of about 3:1 or less, which can easily be filled with metal compared with existing vias that present more challenging aspect ratios, in the range of about 4:1-5:1.

Figure 8A:
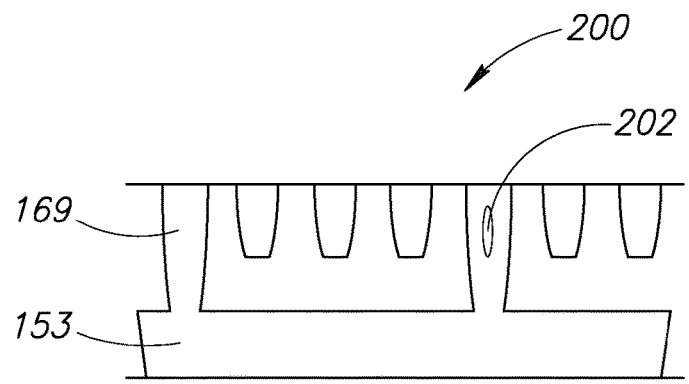
FIGS. 8A and 8B are derived from cross-sectional scanning electron micrographs of a conventional interconnect structure containing high resistance vias and open vias respectively, according to the prior art.
Figure 8B:
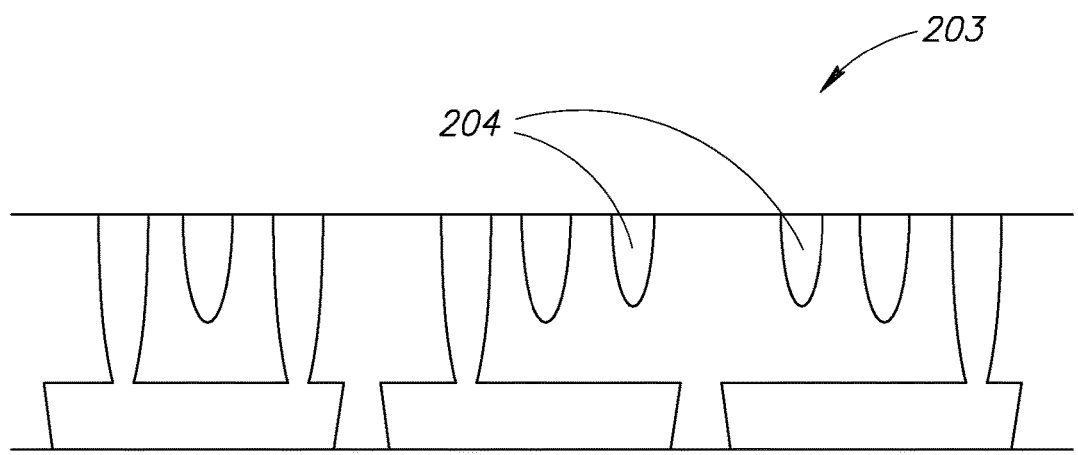

FIGS. 8A and 8B show examples of malformed high aspect ratio vias. FIG. 8A shows a first cross-sectional view 200 of a row of high aspect ratio vias that includes a void 202 due to incomplete via fill. The void 202 will result in a high via resistance. FIG. 8B shows a second cross-sectional view 203 of a row of high aspect ratio vias that includes several incompletely formed vias, for example, 204. Such incomplete formation occurs when the etch process fails to punch through to the underlying metal layer due to excess sidewall polymer formation. The incompletely formed vias 204 will result in open circuits. Such examples of malformed vias can be prevented by reducing the aspect ratio using enlarged diameter vias that are easier to etch and fill.

Figure 9A:
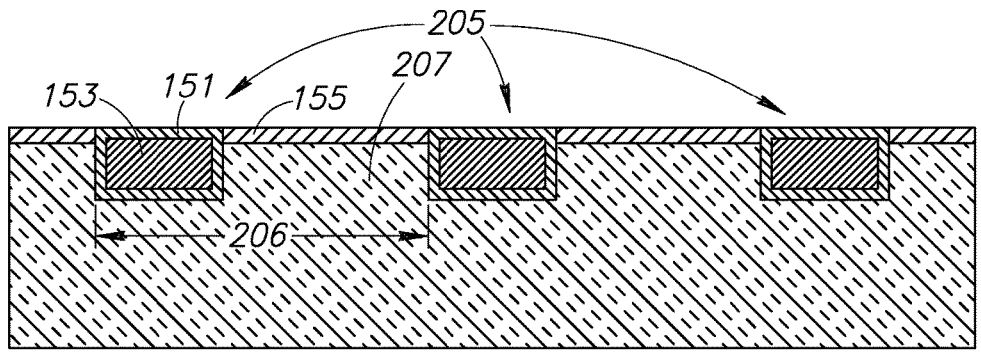
FIGS. 9A, 9B, and 9C are cross-sectional views of an interconnect structure during formation of enlarged diameter vias, according to one embodiment.
Figure 9B:
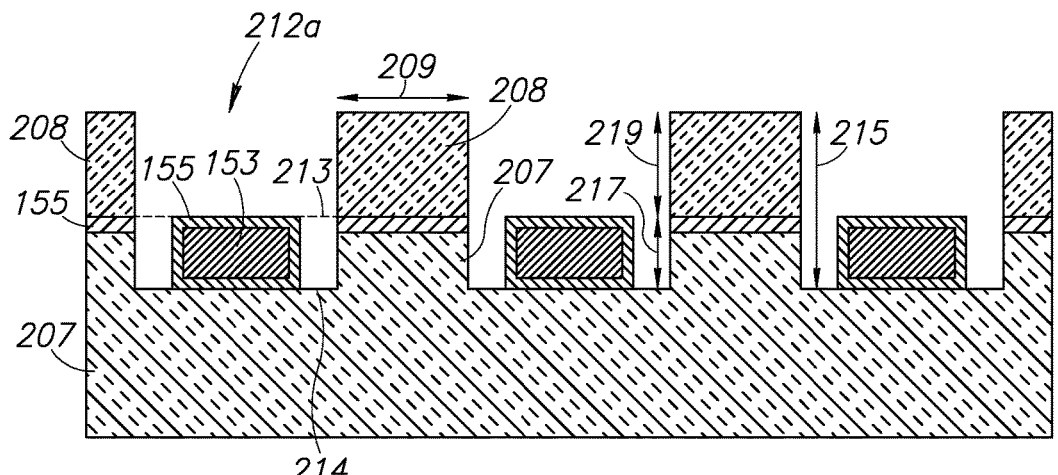
Figure 9C:
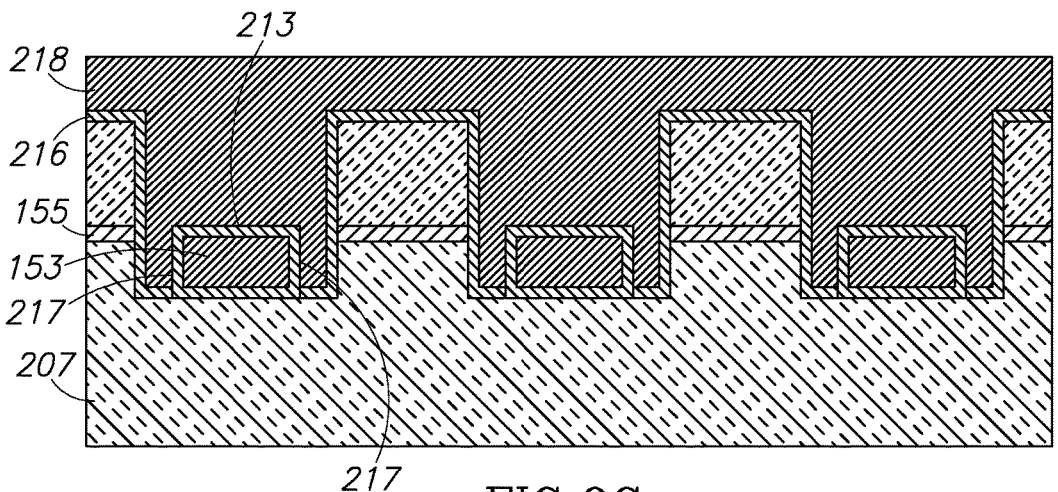

FIGS. 9A, 9B, and 9C show cross-sectional views at successive steps during the formation of enlarged diameter vias according to one embodiment of a dual damascene process. FIG. 9A shows three exemplary metal lines 205 in a first metal layer having a pitch 206. The metal lines 205 are inlaid in a base ULK dielectric material 207. Each metal line includes the metal liner 151, the bulk metal layer 153, and the metal cap layer 155. Each one of the metal lines 205 has a width in the range of about 10-60 nm, with a target width of 24 nm.

With reference to FIG. 9B, following formation of the metal lines 205, a ULK inter-layer dielectric 208 is formed on top of the first metal layer. The metal cap layer 155 separates the base ULK dielectric 207 from the inter-layer dielectric 208. FIG. 9B shows a cross-sectional view after etching symmetric enlarged diameter via openings 212a that are centered with respect to the metal lines 205. Instead of landing on a top surface 213 of the metal lines 205, as is the usual practice in forming vias, the enlarged diameter via openings 212a extend to the lower boundary 214 of the metal lines 205, thus exposing three surfaces of each one of the metal lines 205. Etching the enlarged diameter via openings can be timed to stop on at the lower boundary 214 by use of an advanced process control (APC) scheme. Using APC, in-line film thickness measurements are fed back to the etcher to adjust the etch time so that an enlarged via depth 215 extends to the lower boundary 214. The enlarged via depth 215, which includes a metal trench depth 217 and a conventional via depth 219 is in the range of about 20-150 nm, with a target of 52 nm. About one third of the enlarged via depth 215 is equal to the first metal layer height, and about ⅔ of the enlarged via depth 215 is above the first metal layer. The enlarged diameter via openings 212a have a pitch dimension within the range of about 10-64 nm with a target pitch of about 48 nm. The via aspect ratio is thus only about 1.5-2.0. ULK material separating the metal lines has an insulation width 209, having a target value of about 16 nm.

FIG. 9C shows a cross-sectional view after filling the via openings 212a and forming a second metal layer 218. The second metal layer 218 is vertically spaced apart from the first metal layer by the inter-layer dielectric 208. The via fill includes a via liner 216 and a bulk via fill material which is desirably the same metal as that used to form the bulk metal layer 153. Following formation of the second metal layer 218, for example, by electroplating, a metal planarization process is performed according to methods well known in the art. The completed dual damascene structure is shown in FIG. 9C in which the enlarged diameter via wraps around three sides of the first metal line. As a result, a very large contact area is formed between the filled via and the first metal layer, including the top surfaces 213 of the metal line 205 as well as both sides 217 of the metal line 205. Such a large contact area reduces the via resistance considerably, compared with a contact area for a conventional via that includes only the top of the metal line 205.

Figure 10A:
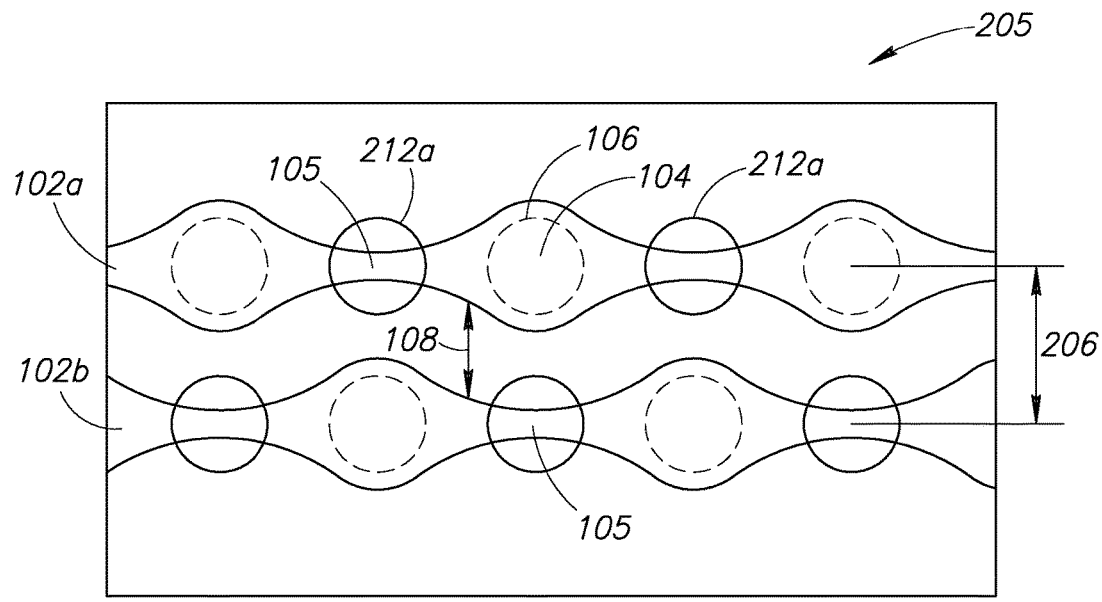
FIGS. 10A and 10B are top plan views of metal lines onto which footprints of the enlarged diameter vias are superimposed, according to one embodiment described herein.
Figure 10B:
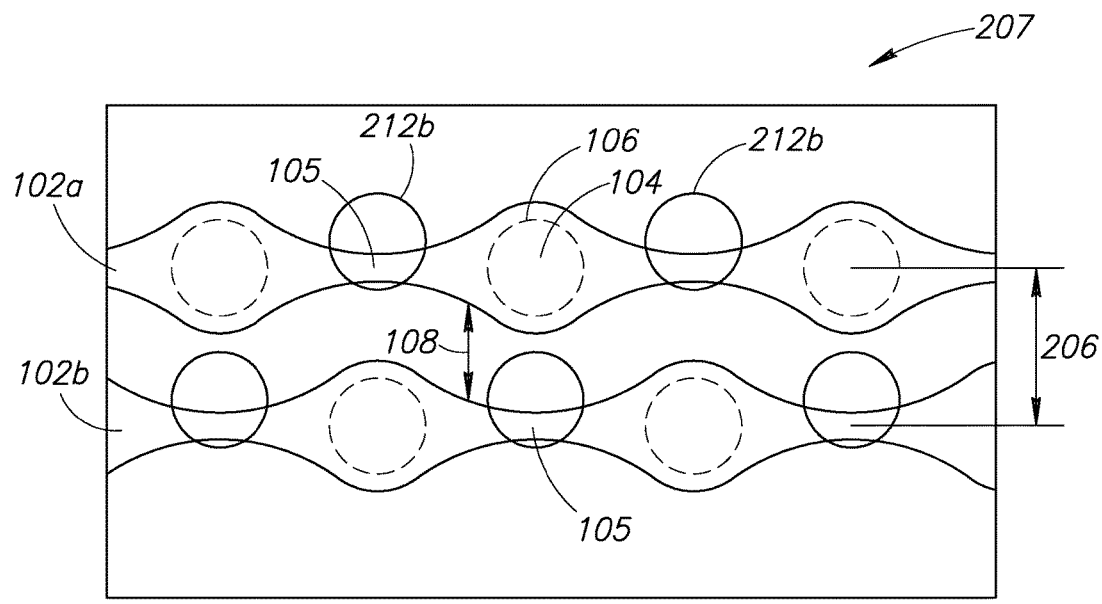

FIGS. 10A and 10B show footprints of the enlarged via openings 212a and large vias 169 according to two exemplary embodiments. The enlarged via openings 212a are superimposed on the narrow portions 105 of the metal lines 205, while landing pads 106 of large vias 169 are superimposed on the wide portions 104. FIG. 10A corresponds to the embodiment shown in FIGS. 9A, 9B, and 9C described above in which the via openings 212a are centered on the metal lines 205 at the plane where the via openings 212a and the metal lines 205 intersect. The center-to-center distance between adjacent via openings 212a corresponds to the pitch dimension 206, and maintains the spacing 108 between adjacent metal lines, e.g., 102a and 102b. The enlarged diameter vias indicated by 212a couple the narrow portions 105 of the metal layer 205 to the next highest metal layer, e.g., a third metal layer, while the enlarged diameter vias indicated by the landing pads 106 couple the wide portions 104 to the next lowest metal layer.

In the embodiment shown in FIG. 10B, enlarged via openings 212b are not centered on the metal lines 205. Instead, the via openings 212b are substantially aligned asymmetrically, with one side of the narrow portions 105 of the metal lines 205, i.e., the via openings 212b are offset from the centers of the metal lines 205. In one embodiment, the via openings 212b are shifted laterally with respect to the metal lines 205. In another embodiment, the via openings 212b have a smaller diameter and may or may not also be shifted laterally with respect to the metal lines 205.

Figure 11A:
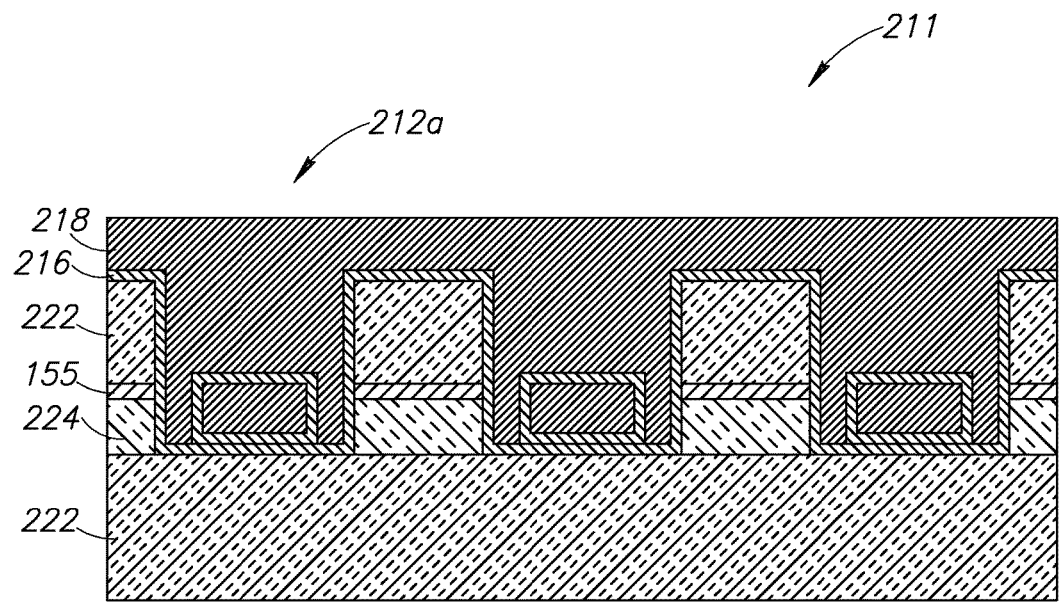
FIGS. 11A and 11B are cross-sectional views of an interconnect structure during formation of enlarged diameter vias, according to one embodiment.
Figure 11B:
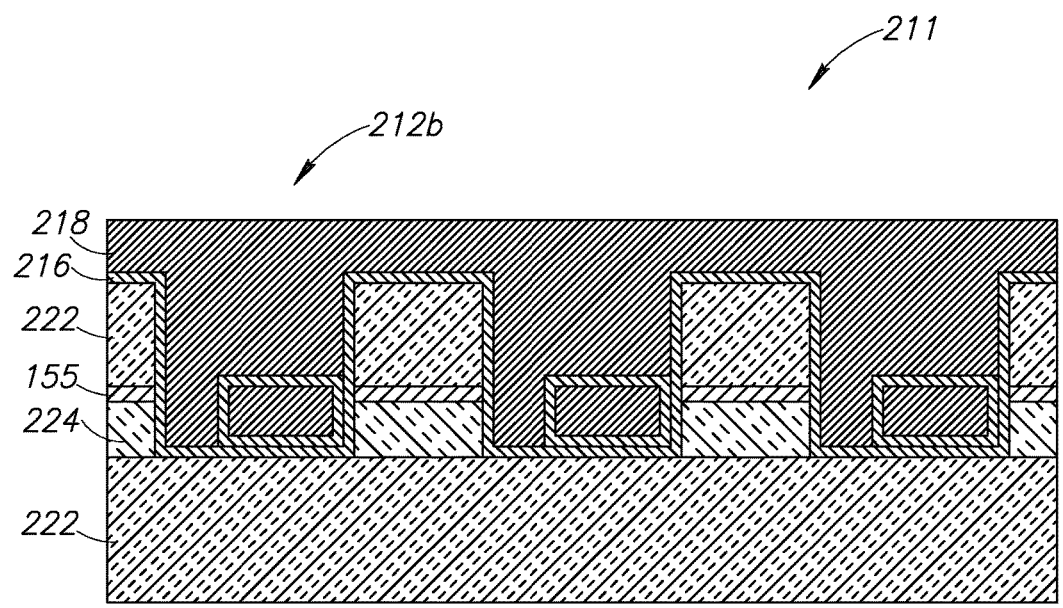

FIGS. 11A and 11B show cross sections of enlarged vias formed using a bi-layer inter-layer dielectric, according to one embodiment. The bi-layer film stack includes two different low k materials supporting the first metal layer. Two such embodiments are shown in which the base ULK dielectric material 207 is replaced with a ULK bi-layer stack. The ULK bi-layer stack includes a first low-k material 222 and a second low-k material 224, such as, for example, a low-k silicon carbide hydroxide (SiCOH, a porous silicon carbide hydroxide (pSiCOH), a UV-cured porogen octomethylcyclotetrasiloxane (OMCTS), or a porogenless UV-cured OMCTS. OMCTS and related materials are discussed in more detail in conference papers published in the Proceedings of the IEEE International Interconnect Technology Conference (IITC) 2005, p. 9, by M. Fukusawa et al., and the Proceedings of the Materials Research Society Advanced Metallization Conference (AMC), 2005, by K. Ida et al. The first and second low-k materials have different dielectric constants k, however both of the low-k materials desirably have k values less than about 4.0. The first low-k material 222 is located below the metal lines 205. The second low-k material 224 has lower and upper surfaces at substantially the same heights as the bottom and top surfaces of the metal lines 205. The first low-k material 222 is also deposited on top of the second low-k material 224. The interface between the first low-k material 222 and the second low-k material 224 serves as a reactive ion etch (RIE) stop layer when etching the enlarged via openings 212a, so that the use of APC to time the etch process becomes unnecessary. Use of the ULK stack also gives circuit designers additional options for crafting trench RC delays and via RC delays. With two different ULK materials, designers can more easily modify the capacitance of the various layers via the k-values, wherein C=κ∈A/d. The enlarged vias shown in FIG. 11A are centered on the metal lines 205, whereas those shown in FIG. 11B are offset so that they align with the right hand walls of the metal lines 205.

Figure 12A:
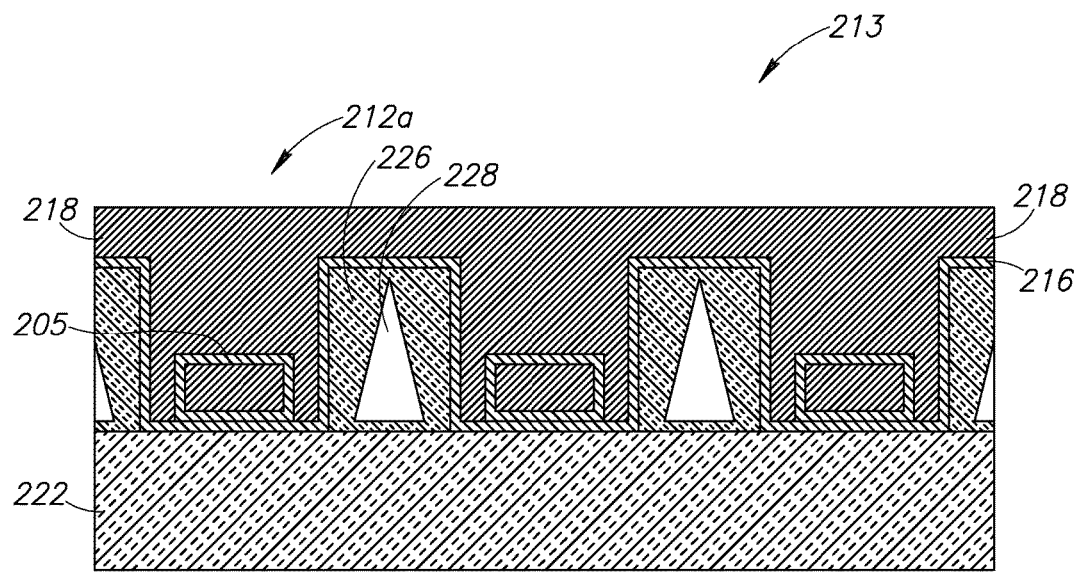
FIGS. 12A and 12B are cross-sectional views of an interconnect structure that features enlarged diameter vias separated by an encapsulating ILD that includes air gaps.
Figure 12B:
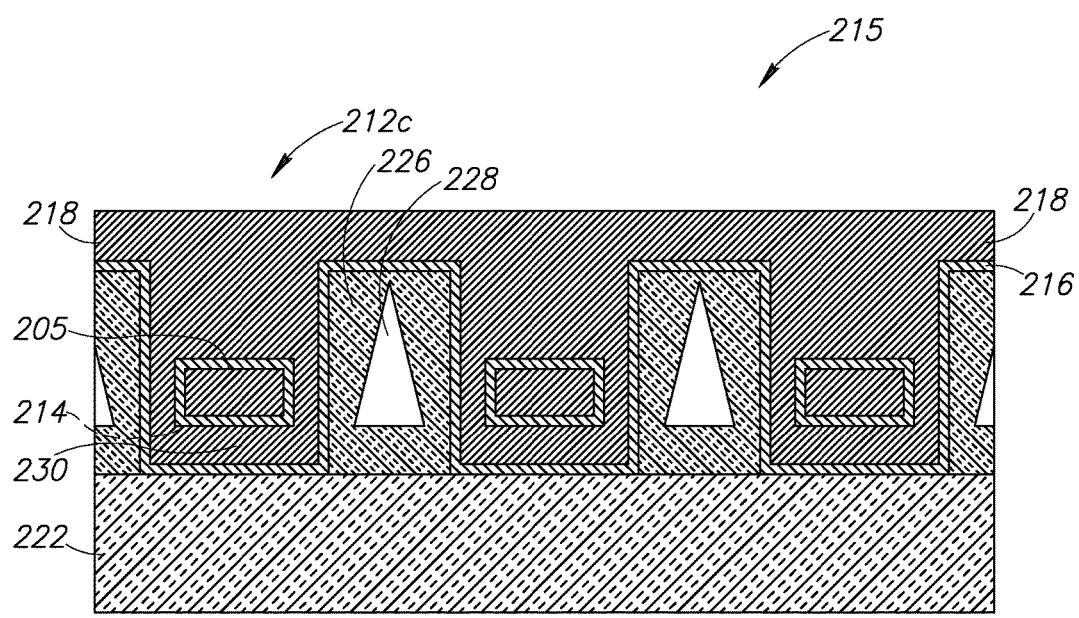

FIGS. 12A and 12B show cross sections of interconnect structures that feature enlarged diameter vias that are electrically supported by the use of an encapsulating ILD 226 containing air gaps 228. Two such embodiments are shown. In both embodiments, the encapsulating ILD 226 is desirably made of a dielectric material such as, for example, silicon carbide (SiC) for better time dependent dielectric breakdown (TDDB) performance than is provided with a ULK material. Use of SiC thus provides a higher reliability interconnect structure in which high voltages are less likely to cause short circuits between adjacent metal lines. Including air gaps 228 in the encapsulating ILD 226 provides a lower capacitance ILD overall to compensate for the higher capacitance of the SiC. The overall capacitance of the ILD including the air gaps 228 is lower because the contribution of the air gaps to the dielectric constant is at the lower limit of 1.0.

The tapered shape of the air gaps 228 provides greater structural stability than is achieved using materials that incorporate air pockets in a more random arrangement. Advantages of such tapered air gaps 228 are described in greater detail in U.S. patent application Ser. No. 14/098,286 entitled, "Advanced Interconnect with Air Gap" and Ser. No. 14/098,346 entitled, "Trench Interconnect Having Reduced Fringe Capacitance". The air gaps 228 have a maximum width in the range of about 10-50 nm with a target width of about 20 nm. In one embodiment, the tapered air gaps 228 extend downward to the lower surface 214 of the underlying metal lines 205.

In FIG. 12A, the enlarged diameter vias are centered around the metal lines 205 as described above, wherein the enlarged contact area between the vias and the metal lines includes three surfaces of the metal lines, consistent with the embodiment shown in FIG. 11A. In FIG. 12B, enlarged diameter via openings 212c are formed so as to extend below the lower surface 214 of the metal lines 205, such that the contact area is increased even further by including all four surfaces of the metal lines 205. Extending the depth of the enlarged diameter vias 212c can be accomplished by over-etching the first low-k material 222 after an endpoint is detected. If the over-etch step uses an isotropic etch chemistry, the metal lines 205 can be undercut to produce the profile shown in FIG. 12B which exposes all four sides of the metal lines 205. The metal lines 205 can be secured at other locations in front of, or behind, the cross-sectional plane shown.

The techniques presented herein are generic and can be used at any metal layer, to ease constraints on via formation, thus supporting metal structures having a variety of different line widths. Without the benefit of the structures and processes described herein, via aspect ratios would continue to increase as the nominal metal line width shrinks with each new technology generation. Thus, severing the dependence of via dimensions on metal line widths has important advantages and implications for future generations of integrated circuit development.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of forming enlarged diameter vias that intersect underlying metal lines, the method comprising:
   forming an inter-layer dielectric (ILD) on top of the underlying metal lines;
   patterning a surface of the ILD with enlarged diameter vias having a characteristic diameter that exceeds a width of the underlying metal lines;
   etching the enlarged diameter vias to an enlarged diameter via depth that extends at least to a lower surface of the underlying metal lines;
   extending the enlarged diameter vias below the lower surface of the underlying metal lines and removing ILD material underneath the underlying metal lines to create all-around vias; and
   filling the all-round vias with a metal liner and a bulk metal.

2. The method of claim 1 wherein removing the ILD material underneath the underlying metal lines includes performing an isotropic etching step.

3. The method of claim 1 wherein etching the enlarged diameter vias further comprises use of an advanced process control system to determine an etch time from statistical in-line measurements.

4. The method of claim 1 wherein forming the ILD includes forming a bi-layer that includes two different ultra-low-k (ULK) dielectric materials.

5. The method of claim 4 wherein an interface of the two different ULK dielectric materials is used as an etch stop layer to determine the enlarged diameter via depth.

6. The method of claim 1, further comprising forming a tapered air gap, the tapered air gap extending downward to the lower surface of the underlying metal lines.

7. The method of claim 1 wherein at least some of the enlarged diameter vias are substantially asymmetrical with respect to the underlying metal lines.

8. A method of forming enlarged diameter vias that intersect underlying metal lines, the method comprising:
   forming an inter-layer dielectric (ILD) on top of the underlying metal lines, wherein the ILD includes a bi-layer that includes two different ultra-low-k (ULK) dielectric materials;
   patterning a surface of the ILD with enlarged diameter vias having a characteristic diameter that exceeds a width of the underlying metal lines;
   etching the enlarged diameter vias to an enlarged diameter via depth that extends at least to a lower surface of the underlying metal lines; and
   filling the enlarged diameter vias with a metal liner and a bulk metal.

9. A method of forming enlarged diameter vias that intersect underlying metal lines, the method comprising:
   forming an inter-layer dielectric (ILD) on top of the underlying metal lines;
   forming a tapered air gap in the ILD, the tapered air gap extending downward to a lower surface of the underlying metal lines;
   patterning a surface of the ILD with enlarged diameter vias having a characteristic diameter that exceeds a width of the underlying metal lines;
   etching the enlarged diameter vias to an enlarged diameter via depth that extends at least to the lower surface of the underlying metal lines; and
   filling the enlarged diameter vias with a metal liner and a bulk metal.

* * * * *